United States Patent [19]

Yamada et al.

[11] Patent Number: 5,100,812
[45] Date of Patent: Mar. 31, 1992

[54] METHOD OF MANUFACTURING SEMICONDUCTOR DEVICE

[75] Inventors: Yoshiki Yamada, Tokyo; Bunshiro Yamaki, Fujisawa, both of Japan

[73] Assignee: Kabushiki Kaisha Toshiba, Kawasaki, Japan

[21] Appl. No.: 625,474

[22] Filed: Dec. 11, 1990

[30] Foreign Application Priority Data

Jan. 26, 1990 [JP] Japan .................................. 2-17300

[51] Int. Cl.$^5$ ............................................ H01L 21/265
[52] U.S. Cl. .................................... 437/31; 437/33; 437/193; 437/194; 437/195; 437/162; 437/909; 148/DIG. 124; 148/DIG. 11
[58] Field of Search ............... 437/31, 32, 33, 909, 437/917, 191, 193, 194, 195, 162; 148/DIG. 11, DIG. 96, DIG. 124

[56] References Cited

U.S. PATENT DOCUMENTS 4,729,965  3/1988  Tamaki et al. ................. 437/162
4,830,972  5/1989  Hamasaki ........................ 437/31

FOREIGN PATENT DOCUMENTS 0067868  3/1987  Japan .

Primary Examiner—Brian E. Hearn
Assistant Examiner—Tuan Nguyen
Attorney, Agent, or Firm—Finnegan, Henderson, Farabow, Garrett and Dunner

[57] ABSTRACT

According to a method of manufacturing a high-frequency bipolar transistor, a p-type base region is formed on an n-type silicon substrate. A first oxide film and a nitride film are formed on the base region. A base contact hole is formed by etching, and a first polysilicon film containing a p-type impurity and serving as a base electrode is formed thereon. A second oxide film having a thickness larger than that of the first oxide film is formed by thermal oxidation around the base contact hole to surround the first polysilicon film. A portion of the nitride film which is not covered with said second oxide film and a portion of the first oxide film therebelow are removed by etching to form an emitter contact hole. A second polysilicon film including an n-type impurity and serving as an emitter electrode is formed in the emitter contact hole. The n-type impurity in the second polysilicon film is diffused in the substrate by annealing to form an n-type emitter region. In the completed bipolar transistor, the base electrode and the emitter electrode are insulated from each other by the second oxide film.

5 Claims, 5 Drawing Sheets

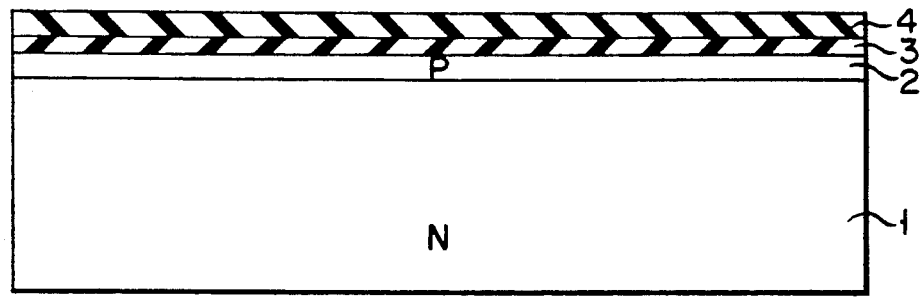
F I G. 3A
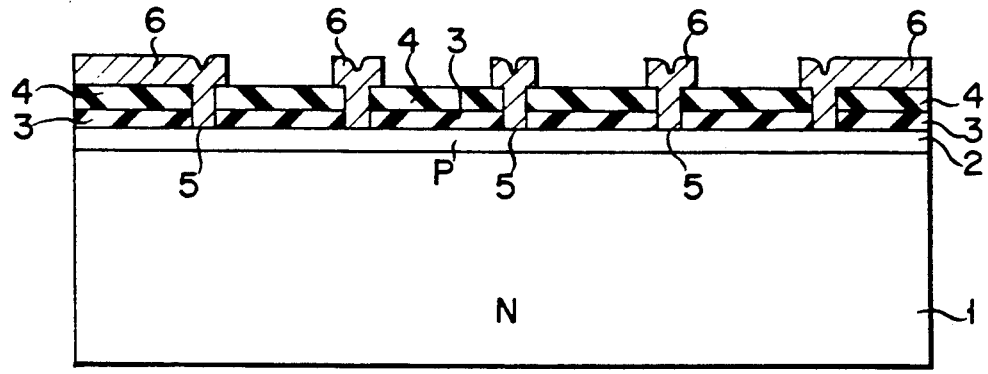
F I G. 3B
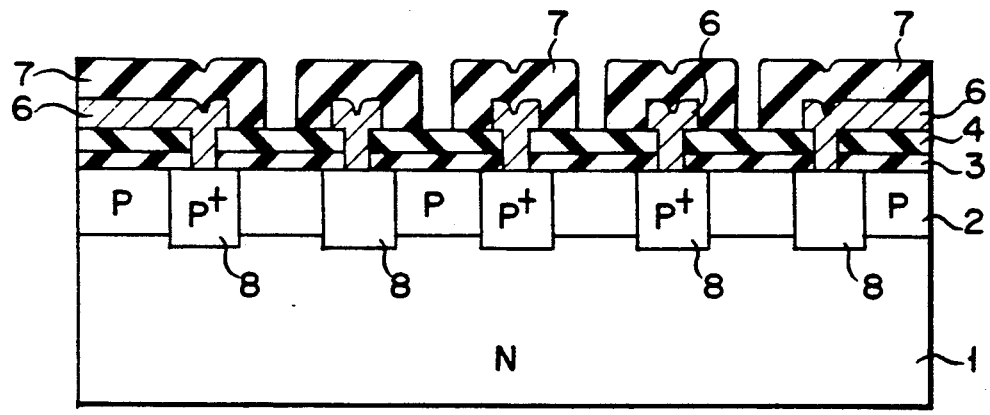
F I G. 3C

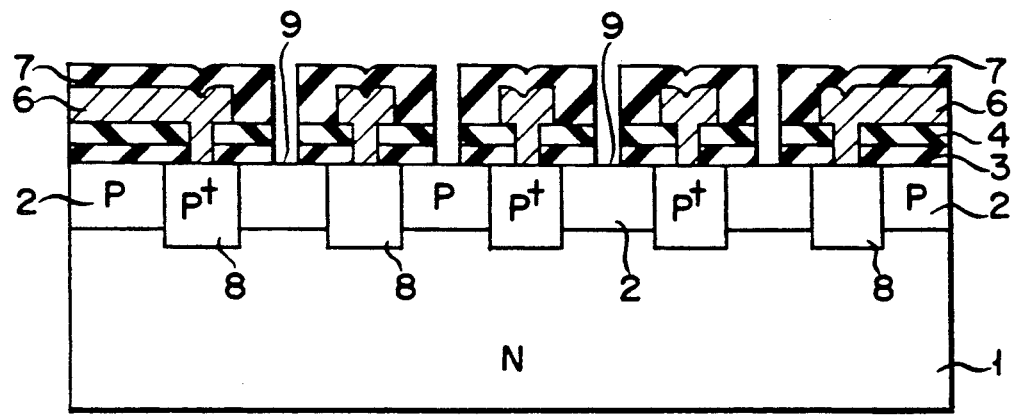
F I G. 3D
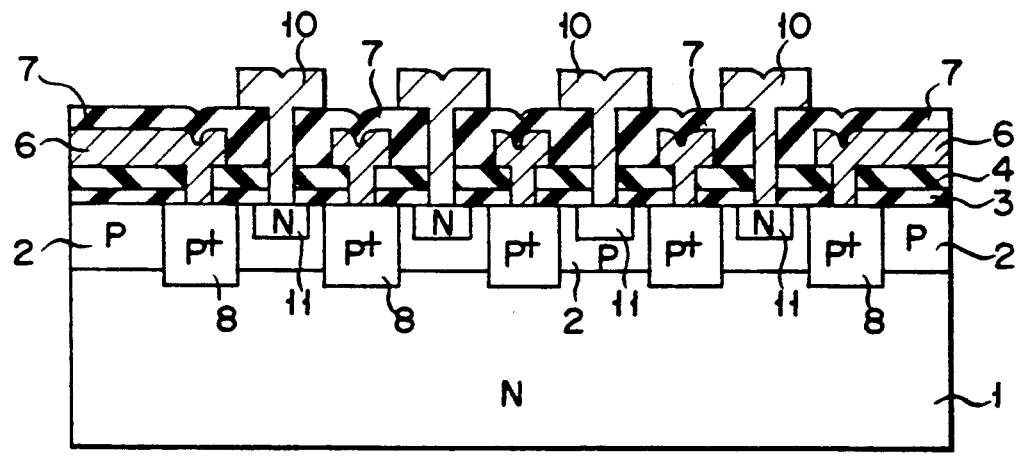
F I G. 3E

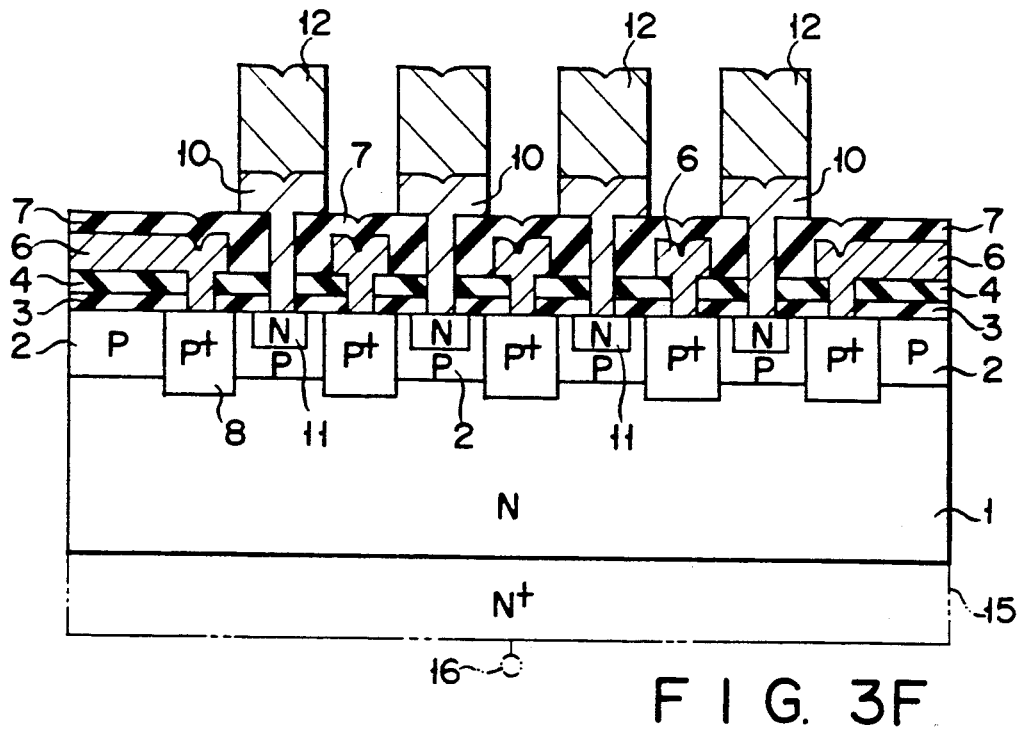
F I G. 3F
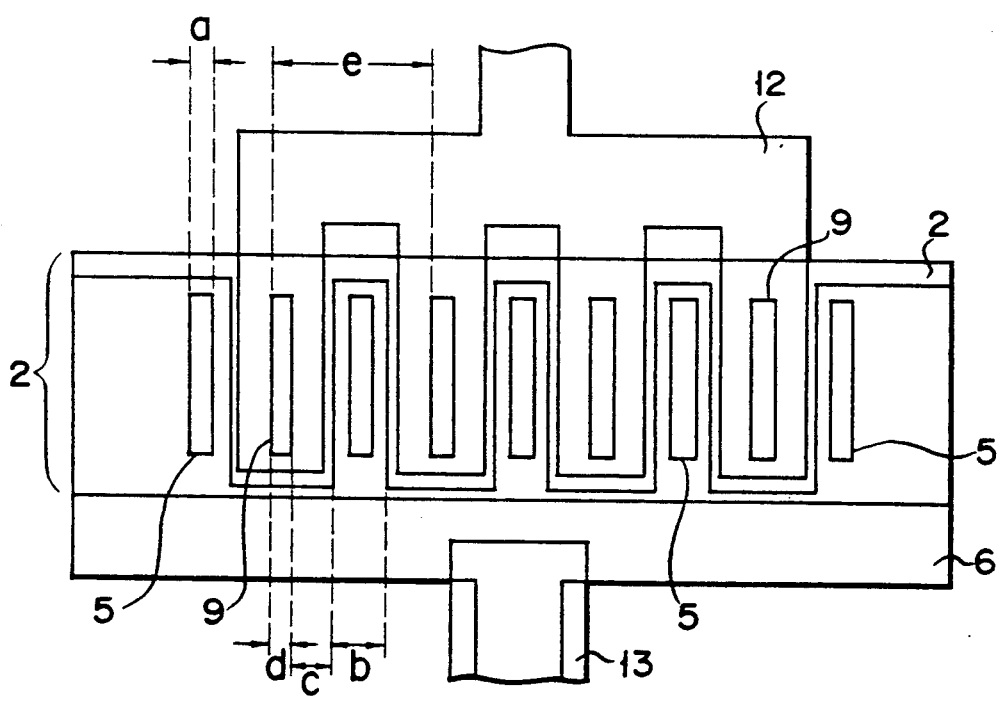
F I G. 4

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a high-frequency bipolar transistor required for a high-speed operation.

2. Description of the Related Art

In order to obtain good high-frequency characteristics in a high-frequency bipolar transistor required for a high-speed operation, an emitter having a long periphery is advantageous. In addition, a low base resistance and a small collector-base capacitance are preferred.

FIGS. 1A to 1C are sectional views sequentially showing conventional steps in manufacturing a high-frequency bipolar transistor. An n-type epitaxial layer 31 is formed on a silicon semiconductor substrate, elements of which are isolated, and a p-type base region 32 and a p+-type graft base region 33 implanted with a high-concentration p-type impurity and connected to the p-type base region 32 later are selectively formed in the epitaxial layer 31. The resultant structure is thermally oxidized to form a silicon oxide film 34, and then a silicon nitride film 35 is formed thereon (FIG. 1A).

In order to form an emitter region, the silicon nitride film 35 and the silicon thermal oxide film 34 on an area between the graft base regions 33 are partly removed by a photolithographic technique to form emitter contact holes 36. A polysilicon layer containing an n-type impurity is deposited on the entire surface of the resultant structure, and the resultant structure is patterned to form emitter electrodes 37. Thereafter, the n-type impurity contained in the polysilicon layer serving as the emitter electrode 37 is thermally diffused in the base region 32 by annealing to form an n-type emitter region 38 (FIG. 1B).

The silicon nitride film 35 and the silicon thermal oxide film 34 on the graft base region 33 are partly removed by a photolithographic technique to form base contact holes 39. Thereafter, an emitter electrode aluminum wiring layer 40 and a base electrode aluminum wiring layer 41 are patterned (FIG. 1C).

FIG. 2 is a plan view showing a pattern of the arrangement in FIG. 1C. The pattern is formed to have conditions for obtaining good high-frequency characteristics. That is, each of the emitter contact holes 36 is divided into a plurality of stripes so that an emitter has a long periphery. Therefore, base contact holes 39 are formed to put the corresponding emitter contact hole 36, therebelow to decrease base resistance.

In order to decrease the collector-base capacitance, base area must be decreased. As shown in FIG. 2, the emitter stripe has a width a and a pitch b which are set to be as small as possible.

However, as the pitch b of the emitter stripe is decreased, the interval between the emitter electrode aluminum wiring layer 40 and the base electrode aluminum wiring layer 41 is decreased. The margin for mask alignment using photolithographic etching becomes extremely decreased, making the emitter electrode and the base electrode easily short-circuited.

Thus, in accordance with the limitation due to the photolithographic technique, it is difficult when the pitch of the emitter stripe is decreased to a minimum line width, or less, because defects occur in the transistor.

SUMMARY OF THE INVENTION

The present invention has been conceived in consideration of the above problem, and has as its object to provide a method of manufacturing a semiconductor device for obtaining a highly reliable high-frequency bipolar transistor capable of decreasing the pitch of an emitter stripe.

In order to achieve the above object, according to the present invention, there is provided a method of manufacturing of a semiconductor device, comprising the steps of; forming a first oxide film on a semiconductor substrate by thermal oxidation; forming a nitride film on the first oxide film, removing each portion of the first oxide film and the nitride film by etching to expose a first portion selected from the substrate; forming a first polysilicon film of a first conductivity type of the first exposed portion of the substrate; forming a second oxide film thicker than the first oxide film on a portion selected from the nitride film and on the first polysilicon film to surround the first polysilicon film; removing a portion of the nitride film which is not covered with the second oxide film and a portion of the first oxide film therebelow by etching to expose a second portion of the substrate; and forming a second polysilicon film of a second conductivity type on the second exposed portion of the substrate.

According to a preferable aspect, the method of manufacturing a semiconductor device includes the step of forming a region of a first conductivity type on the semiconductor substrate prior to the step of forming the first oxide film, and the first oxide film is formed on the region.

According to the method of the present invention, when the method is applied to a bipolar transistor, the first oxide film and the nitride film are formed on the region of the first conductivity type prospectively serving as a base region. Each part of these films is etched to form a base contact hole, and the first polysilicon film including an impurity of the first conductivity type and prospectively serving as the base region is formed in the base contact hole. A second oxide film is formed on the first polysilicon film by thermal oxidation to have a thickness larger than that of the first oxide film and to expose part of the surface of the nitride film between base electrodes. At the same time, a high-concentration impurity of a first conductivity type is implanted in the base region to form a graft base region.

Thereafter, the exposed nitride film and the first oxide film are etched to form an emitter contact hole. A second polysilicon film including an impurity of the second conductivity type and prospectively serving as an emitter electrode is deposited on the resultant structure and patterned. That is, the second oxide film formed on the base electrode becomes a mask for forming the emitter contact hole, and the emitter electrode is self-aligned. The second oxide film contributes to prevent a short circuit between the emitter electrode and the base electrode. In addition, since the emitter electrode and the base electrode are respectively extracted from different directions, the interval between electrodes can be decreased.

According to the method of the present invention, since the emitter electrode is insulated from the base electrode by an oxide film, even when the interval between emitter stripes is decreased, the emitter electrode and the base electrode are not short-circuited. Therefore, the interval between the emitter stripes can be decreased to reduce the base resistance and the collector base capacitance. In addition, the width of an emitter contact can be decreased, and this contributes to a reduction in the base resistance. As a result, there is provided a method of manufacturing a semiconductor device for obtaining a highly reliable high-frequency bipolar transistor operated at a high speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 3A to 3F are sectional views sequentially showing a method of manufacturing a bipolar transistor according to the first embodiment of the present invention; and FIG. 4 is a plan view showing a structure of the high-frequency bipolar transistor in FIG. 3F.

DETAILED DESCRIPTION OF THE PREFERRED EMBODIMENTS

Figure 1A:
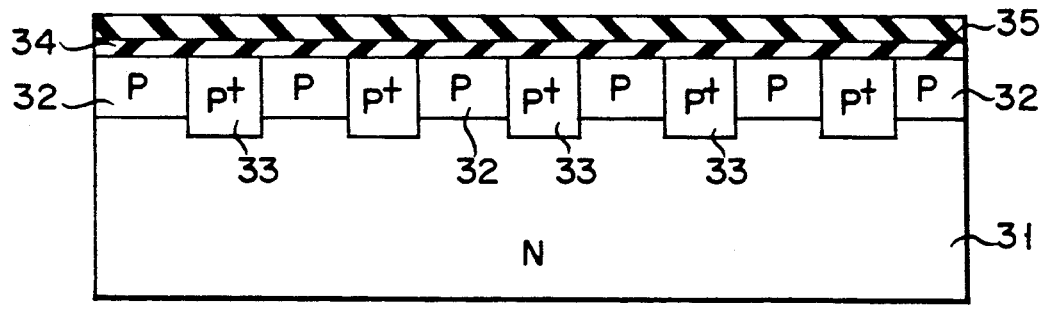
FIGS. 1A to 1C are sectional views sequentially showing a conventional method of manufacturing a conventional high-frequency bipolar transistor.

Referring to FIGS. 3A to 3F, according to a manufacturing method of this embodiment, an epitaxial layer 1 doped with an n-type impurity is formed on a silicon semiconductor substrate, elements of which are isolated. A p-type impurity such as boron is ion-implanted in the epitaxial layer 1 to form a p-type base region 2. Thereafter, the resultant structure is thermally oxidized to form a silicon thermal oxide film 3 having a thickness of about 1,000 Å, and a silicon nitride film 4 having a thickness of about 1,000 Å is formed on the silicon thermal oxide film 3 by a low-pressure CVD method or the like (FIG. 3A).

Parts of the silicon nitride film 4 and the silicon thermal oxide film 3 are sequentially removed using a photolithographic technique by an RIE (reactive ion etching) method to form a base contact hole 5 having a width of about 0.7 μm. Subsequently, a polysilicon layer containing a p-type impurity is deposited on the entire surface of the resultant structure and patterned to form a base electrode 6 (FIG. 3B).

The resultant structure is entirely thermally oxidized, and a thermal oxide film 7 having a thickness of, e.g., 3,000 Å larger than that of the thermal oxide film 3 is formed on a p-type polysilicon film including a p-type impurity and serving as the base electrode 6. The thermal oxide film 7 is formed to expose a part of the surface of the silicon nitride film 4 between each base electrode 6. At the same time, the impurity contained in the base region 2 is thermally diffused in the epitaxial layer to increase the thickness of the base region 2. In addition, the p-type impurity contained in the base electrode 6 is diffused in the base region 2 to form a p+-type graft base region 8 obtained by doping a p-type impurity at a high concentration (FIG. 3C).

The exposed silicon nitride film 4 and the thermal oxide film 3 therebelow are removed by etching to expose the substrate. In this case, the etching is performed at an etching rate for etching only the silicon nitride film 4 at first, and then the thermal oxide film 3 is etched. At this time, since the thermal oxide film 7 on the base electrode 6 has a thickness sufficiently larger than that of the thermal oxide film 3, it remains. Therefore, an emitter contact hole 9 is formed using the thermal oxide film 7 as a mask (FIG. 3D).

A polysilicon film including an n-type impurity is deposited entirely on the resultant structure, and it is patterned by a photolithographic technique to form an emitter electrode 10. Thereafter, the n-type impurity in the polysilicon of the emitter electrode 10 is thermally diffused in the p-type base region 2 by annealing to form an n-type emitter region 11 (FIG. 3E).

An emitter electrode aluminum wiring layer 12 and a base electrode aluminum wiring layer 13 (shown in FIG. 4, described later) are formed by patterning (FIG. 3F).

In FIG. 3F, as a discrete type bipolar transistor, an n+-type substrate 15 and a collector electrode 16 are illustrated by two-dot chain line.

Figure 1B:
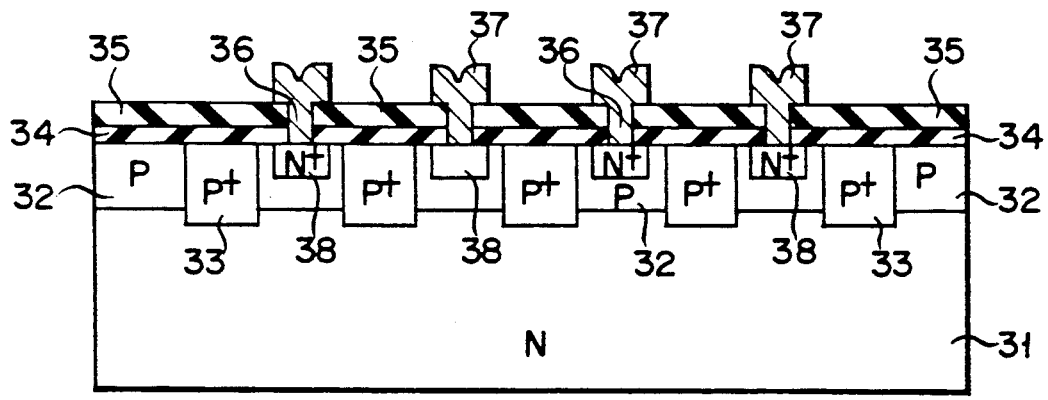
Figure 1C:
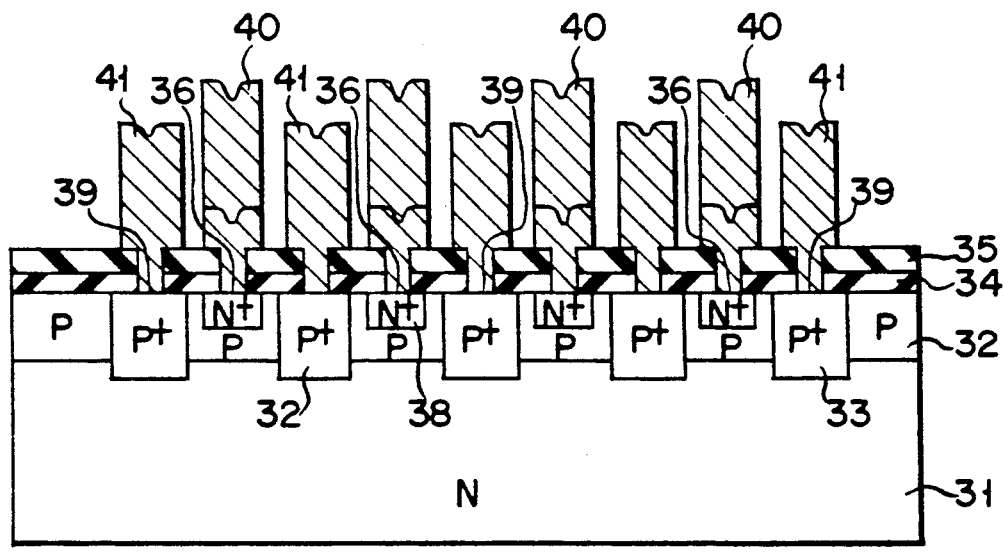
Figure 2:
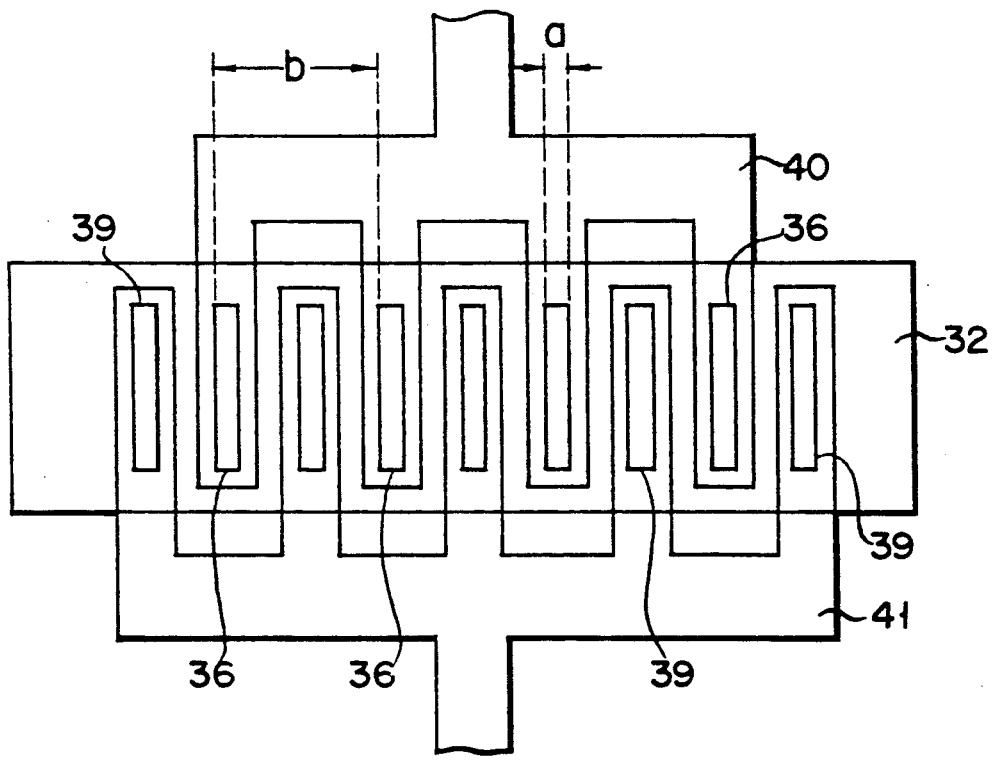
FIG. 2 is a plan view showing a pattern of structure of the conventional high-frequency bipolar transistor in FIG. 1C.

FIG. 4 is a plan view showing a pattern of the arrangement shown in FIG. 3F. The base electrode 6, covered with the thermal oxide film 7, shown in FIG. 1 is extracted by the aluminum wiring layer 13 from a direction which is different from the extracting direction of the emitter electrode 10, i.e., a direction parallel to the substrate.

Since a conventional emitter contact hole is formed by a photolithographic technique, the maximum width of the emitter contact hole is 0.7 μm. When the emitter and base electrodes are extracted in the same direction, these electrodes may be short-circuited. Therefore, the interval between these electrodes cannot be further decreased.

On the contrary, according to the method of this embodiment, the thermal oxide film 7 serves as a mask for forming an emitter contact hole, and the emitter electrode is self-aligned. A short circuit between the emitter and base electrodes is prevented by the thermal oxide firm 7. In addition, since the emitter and base electrodes are hot extracted from the same direction, even when a photolithographic technique using a conventional mask alignment margin is used, the interval between electrodes can be largely decreased.

For example, assuming that the margin for mask alignment is set to be 0.5 μm and the width of minimum dimensions used in a photolithographic technique is set to be 0.7 μm, the width a of the base contact hole 5 is 0.7 μm and the width b of the base electrode polysilicon film 6 is 1.7 μm. After the resultant structure is thermally oxidized to form the thermal oxide film 7 having a width c of 0.3 μm (3,000 Å), when the emitter contact hole 9 is formed to have a width d of 0.5 μm, the width e of the emitter stripe can be decreased to 2.8 μm.

Note that, according to this embodiment, the polysilicon film serving as the emitter electrode 10 contains an impurity in advance, but an impurity may be implanted in a polysilicon film in which an impurity is not implanted. In addition, although the base region 2 is formed prior to formation of a base contact hole, the base region 2 may be formed by implanting impurity ions through an emitter contact hole after the emitter contact hole is formed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a bipolar transistor, comprising the steps of:

forming a first semiconductor layer of a first conductivity type;

forming a second semiconductor layer of a second conductivity type on the first semiconductor layer of the first conductivity type;

forming a first oxide film on the second semiconductor layer by thermal oxidation;

forming a nitride film on the first oxide film;

removing first portions of the first oxide film and first portions of the nitride film by etching to expose first portions of the second semiconductor layer to form base contact holes;

forming base electrodes in the base contact holes, each of the base electrodes being made of polysilicon film containing an impurity of the second conductivity type;

forming a second oxide film having a thickness larger than that of the first oxide film, by a thermal treatment, around each of the base contact holes to surround each of the base electrodes;

diffusing the impurity of the second conductivity type contained in the base electrodes into the second semiconductor layer by the thermal treatment to form graft base regions of the second conductivity type;

removing second portions of the nitride film which are not covered with the second oxide film by etching to expose second portions of the first oxide film therebelow;

etching the second portions of the first oxide film to expose second portions of the second semiconductor layer to form emitter contact holes using the second oxide film as a mask, the difference in thickness between the first and second oxide films being utilized to leave an amount of the second oxide film remaining after etching;

forming emitter electrodes in the emitter contact holes, each of the emitter electrodes being made of polysilicon film containing an impurity of the first conductivity type; and diffusing the impurity of the first conductivity type contained inn the emitter electrodes into the second semiconductor layer by annealing to form emitter regions of the first conductivity type; whereby the base electrodes and the emitter electrodes are arranged in an alternating manner.

2. A method according to claim 1, wherein said steps of etching are performed by reactive ion etching.

3. A method according to claim 1, wherein said step of forming said nitride film is performed by low-pressure chemical vapor deposition.

4. A method according to claim 1, wherein the first and second semiconductor layers are silicon layers, and the oxide film and the nitride film are, respectively, a silicon oxide film and a silicon nitride film.

5. A method according to claim 1, wherein the width of each of the emitter contact holes is determined by selecting a distance between the base electrodes on both sides thereof and the thickness of the second oxide film surrounding the base electrodes.

* * * * *